United States Patent

[19]

Ma

[11] Patent Number: 6,118,693
[45] Date of Patent: Sep. 12, 2000

[54] ELECTRICALLY ERASABLE NON-VOLATILE MEMORY CELL WITH INTEGRATED SRAM CELL TO REDUCE TESTING TIME

[75] Inventor: Benny Ma, Saratoga, Calif.

[73] Assignee: Lattice Semiconductor Corporation, Hillsboro, Oreg.

[21] Appl. No.: 09/320,389

[22] Filed: May 26, 1999

[51] Int. Cl.[7] ................................................ G11C 16/04
[52] U.S. Cl. ................ 365/185.05; 365/185.1; 365/189.08; 326/38; 326/39
[58] Field of Search ......................... 365/185.01, 185.05, 365/185.1, 185.08; 326/38, 39, 44

[56] References Cited

U.S. PATENT DOCUMENTS

| | | | |
|---|---|---|---|
| 5,272,368 | 12/1993 | Turner et al. | 365/185.01 |
| 5,548,228 | 8/1996 | Madurawe | 365/189.08 |
| 5,815,726 | 9/1998 | Cliff | 326/39 |
| 5,818,254 | 10/1998 | Agrawal et al. | 326/39 |

*Primary Examiner*—Son Mai
*Attorney, Agent, or Firm*—Skjerven, Morrill, MacPherson Franklin & Friel, LLP; Edward C. Kwok

[57] ABSTRACT

In a programmable integrated circuit, by providing a static random access memory (SRAM) cell in each electrically erasable ($E^2$) non-volatile memory cell, testing time of circuits configured by the $E^2$ non-volatile memory cells can be reduced substantially. In one embodiment, the SRAM cell can be included by providing a small number of transistors to recirculate the output value of an inverting buffer. During testing, a logic value is written into the SRAM cell in place of the logic value in the non-volatile storage of the $E^2$ non-volatile memory cell. In one embodiment, the $E^2$ non-volatile memory cell can be used in conjunction with a 1-bit shift-register. Multiple 1-bit shift registers can be used as a scan chain to scan into the SRAM cells of multiple $E^2$ non-volatile memory cells.

9 Claims, 4 Drawing Sheets

ELECTRICALLY ERASABLE NON-VOLATILE MEMORY CELL WITH INTEGRATED SRAM CELL TO REDUCE TESTING TIME

BACKGROUND OF THE INVENTION

1. Field of the Invention

The present invention relates to electrically erasable ("$E^2$") non-volatile memory cells. In particular, the present invention relates to the design and testing of $E^2$ non-volatile memory cells in a programmable integrated circuit.

2. Discussion of the Related Art

FIG. 1 is a schematic circuit of a typical $E^2$ cell 100 used as a non-volatile configuration fuse. Such a configuration fuse, for example, can be used to configure a programmable logic circuit ("PLD"). As shown in FIG. 1, $E^2$ cell 100 includes a storage transistor device 101 with a floating gate electrode which is also the gate electrode of sense transistor 102. Storage transistor device 101 is programmed or erased during "programming mode", and read during "user mode". During programming mode, to erase storage transistor device 100, storage transistor device 101 is selected by raising the voltage at the gate terminal 108 of NMOS transistor 115 to a voltage approximately equal to ($V_{CC}$-$V_{TN}$), where $V_{CC}$ and $V_{TN}$ are the supply voltage and the threshold voltage of an NMOS transistor, respectively. At the same time, terminal 107 (a bit line) is grounded and terminal 110 is raised to a high programming voltage ($V_{PP}$) to place "negative charges" onto the floating gate. Conversely, to program storage transistor device 101, storage transistor device 101 is selected by raising the voltage at the gate terminal 108 of NMOS transistor 115 to a voltage approximately equal to ($V_{PP}$+$V_{TN}$). At the same time, terminal 107 (bit line) is raised to a high programming voltage, and terminal 110 is grounded to drain negative charges from the floating gate. The programming and erase times of $E^2$ cell 100 can each be as much as 20 milliseconds.

During programming mode, to verify the content of storage transistor device 101, storage transistor device 101 is selected by providing, respectively, a voltage ground at terminal 108 and a logic high voltage at terminal 109. Terminal 109 is coupled to the gate terminal of NMOS transistor 103. Gate terminal 114 of NMOS transistor 111 is also provided a voltage of $V_{CC}$. During verify, the bit line (i.e., terminal 107) is pulled up to a logic high voltage by a small current reference and sensed. If storage transistor device 101 is programmed, NMOS transistor 102 is conducting (i.e., the voltage at the gate terminal of NMOS transistor 102 is positive), thus pulling the voltage at terminal 116 to ground. Inverter 105 thus provides a logic high voltage at output terminal 106. Since terminal 106 is at a logic high voltage, conducting transistors 111 and 112 pull terminal 107 down. Conversely, if storage transistor device 101 is erased, transistor 102 is not conducting. Transistor 104, which receives the bias voltage "Biasp" at gate terminal 113, pulls terminal 116 to a logic high voltage. Consequently, inverter 105 provides a logic low voltage at terminal 106. Thus, the voltage at terminal 107 is not pulled down.

To read the content of storage transistor device 101, storage transistor device 101 is selected by providing a logic high voltage at terminal 109, which is coupled to the gate terminal of NMOS transistor 103. Drain terminal 116 of transistor 103 is coupled to the drain terminal of PMOS transistor 104, which receives a bias voltage "Biasp" at its gate terminal 113. If storage transistor device 101 is programmed, NMOS transistor 102 is conducting (i.e., the voltage at the gate terminal of NMOS transistor 102 is positive), thus pulling the voltage at terminal 116 to ground. Inverter 105 thus provides a logic high voltage at output terminal 106, indicating that storage transistor device 101 is programmed. Conversely, if storage transistor device 101 is erased, transistor 102 is not conducting. Transistor 104, which receives the bias voltage Biasp at gate terminal 113, pulls terminal 116 to a logic high voltage. Consequently, inverter 105 provides a logic low voltage at terminal 106 to indicate that storage transistor device 101 is erased.

One drawback of $E^2$ cell 100 is, when storage transistor cell 101 is programmed, a current which is drawn through PMOS transistor 104 and NMOS transistors 102 and 103 during a read operation. Although this current is limited to a few microamps by the bias voltage at terminal 113, the current can be significant when a large number of $E^2$ cells exist in a programmable integrated circuit.

Another drawback of $E^2$ cell 100 relates to the long programming and erasing times. To perform a function test of a circuit implemented in the programmable integrated circuit, it is often necessary to change the programmed or erased states of multiple $E^2$ cells multiple times. For example, in a demultiplexer circuit which demultiplexes a data bus to twenty data destinations, the $E^2$ cells that configure the demultiplexer will each have to be programmed or erased more than twenty times. The time required for such a functional test can become prohibitively long.

SUMMARY OF THE INVENTION

In a programmable integrated circuit, by providing a static random access memory (SRAM) cell in each electrically erasable ($E^2$) non-volatile memory cell, testing time of circuits configured by the $E^2$ non-volatile memory cells can be reduced substantially. In one embodiment, the SRAM cell can be included by providing a small number of transistors to recirculate the output value of an inverting buffer. During testing, a logic value is written into the SRAM cell in place of the logic value in the non-volatile storage of the $E^2$ non-volatile memory cell. In one embodiment, the $E^2$ non-volatile memory cell can be used in conjunction with a 1-bit shift-register. Multiple 1-bit shift registers can be used as a scan chain to scan into the SRAM cells of multiple $E^2$ non-volatile memory cells.

In one embodiment, the electrically erasable non-volatile memory cell of the present invention includes: (a) a storage cell including a floating gate transistor, for storing a logic value; (b) an input transistor controlled by a first control signal at the word line, which couples a bit line to the storage cell to allow a logic voltage on the bit line to be written into the storage cell; (c) a pass transistor controlled by a second control signal which provides the logic value to be read out from the storage cell; and (d) a latch coupled to the pass transistor to receive the logic value read out, where the latch can also be written from the bit line.

In one embodiment, the latch is formed by a first inverter coupled to the pass transistor and a second inverter cross-coupled to the first inverter. The second inverter recirculates the logic value of the output terminal of the first inverter to the input terminal of the first inverter. In this embodiment, the second inverter also couples the bit line to allow the logic voltage to be placed on the input terminal of the first inverter. A pull-up transistor receiving a bias voltage can also be provided to drive the input terminal of the first inverter to a supply voltage. In one embodiment, the second inverter is activated by an enable signal.

The present invention is better understood upon consideration of the detailed description below and the accompanying drawings.

BRIEF DESCRIPTION OF THE DRAWINGS

To facilitate cross-referencing between the figures, like elements are provided like reference numerals.

DETAILED DESCRIPTION OF THE PREFERRED EMBODIMENTS

Figure 1:
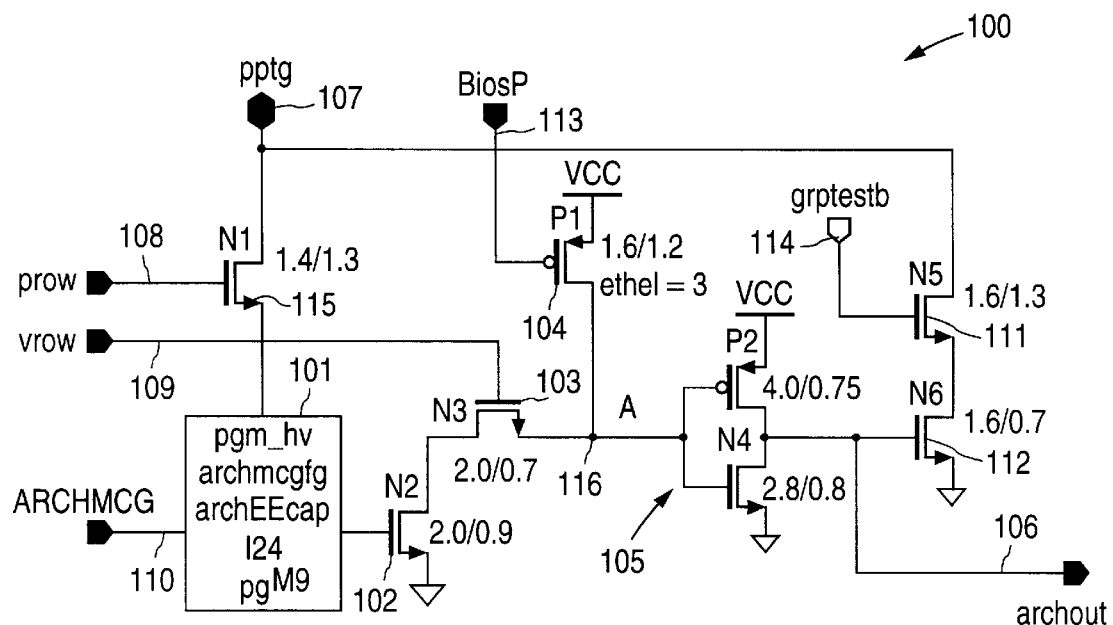
FIG. 1 is a schematic circuit of a typical E cell 100 used as a non-volatile configuration fuse.
Figure 2:
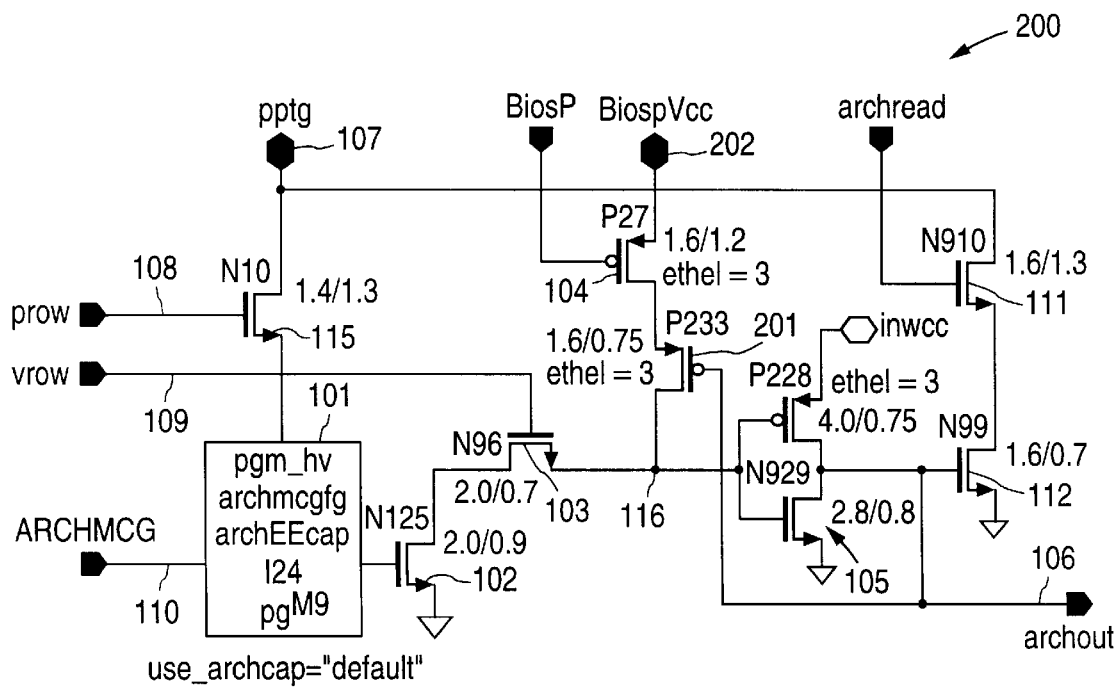
FIG. 2 is a schematic circuit of $E^2$ cell 200, in accordance with one embodiment of the present invention.

FIG. 2 is a schematic circuit of $E^2$ cell 200, in accordance with one embodiment of the present invention. $E^2$ cell 200 differs from $E^2$ cell 100 of FIG. 1 by including a PMOS transistor 201 between terminal 116 and the drain terminal of PMOS transistor 104, and by providing terminal 202, which provides a delayed supply voltage for inverter 105 during power-up. The gate terminal of NMOS transistor 201 is coupled to terminal 106, which is the output terminal of $E^2$ cell 200. The programming, erasing and verifying operations of $E^2$ cell 200 are substantially the same as those of $E^2$ cell 100 described above, and thus are not repeated here.

To read the content of storage transistor device 101 of $E^2$ cell 200, storage transistor device 101 is selected by providing a logic high voltage at terminal 109, which is coupled to the gate terminal of NMOS transistor 103. Drain terminal 116 of transistor 103 is coupled to the source terminal of NMOS transistor 201. If storage transistor device 101 is programmed, NMOS transistor 102 is conducting (i.e., the voltage at the gate terminal of NMOS transistor 102 is positive), thus pulling the voltage at terminal 116 to ground. Since the voltage at terminal 106 is initialized to be a logic low voltage in this instance (discussed below), PMOS transistor 201 is conducting. Conducting transistors 102 and 103 pull terminal 116 to a logic low voltage. When the delayed supply voltage on terminal 202 is driven to a logic high voltage, inverter 105 switches terminal 106 to a logic high voltage and turns off the conducting path through PMOS transistor 201. Hence, there is no current path thorough PMOS transistor 104 and NMOS transistor 102 and 103. Inverter 105 provides a logic high voltage at output terminal 106, indicating that storage transistor device 101 is programmed.

Conversely, if storage transistor device 101 is erased, transistor 102 is not conducting. Since the voltage at terminal 106 is initialized to be a logic low voltage in this instance (discussed below), PMOS transistor 201 is conducting. Transistor 104, which receives the bias voltage "Biasp" at gate terminal 113, pulls terminal 116 to a logic high voltage. Consequently, when the delayed supply voltage at terminal 202 is driven to a logic high voltage, inverter 105 maintains a logic low voltage at terminal 106 to indicate that storage transistor device 101 is erased.

Since there is no current path from $V_{CC}$ to ground, $E^2$ cell 200 draws very little current during a read operation, regardless of its programmed state.

Figure 3:
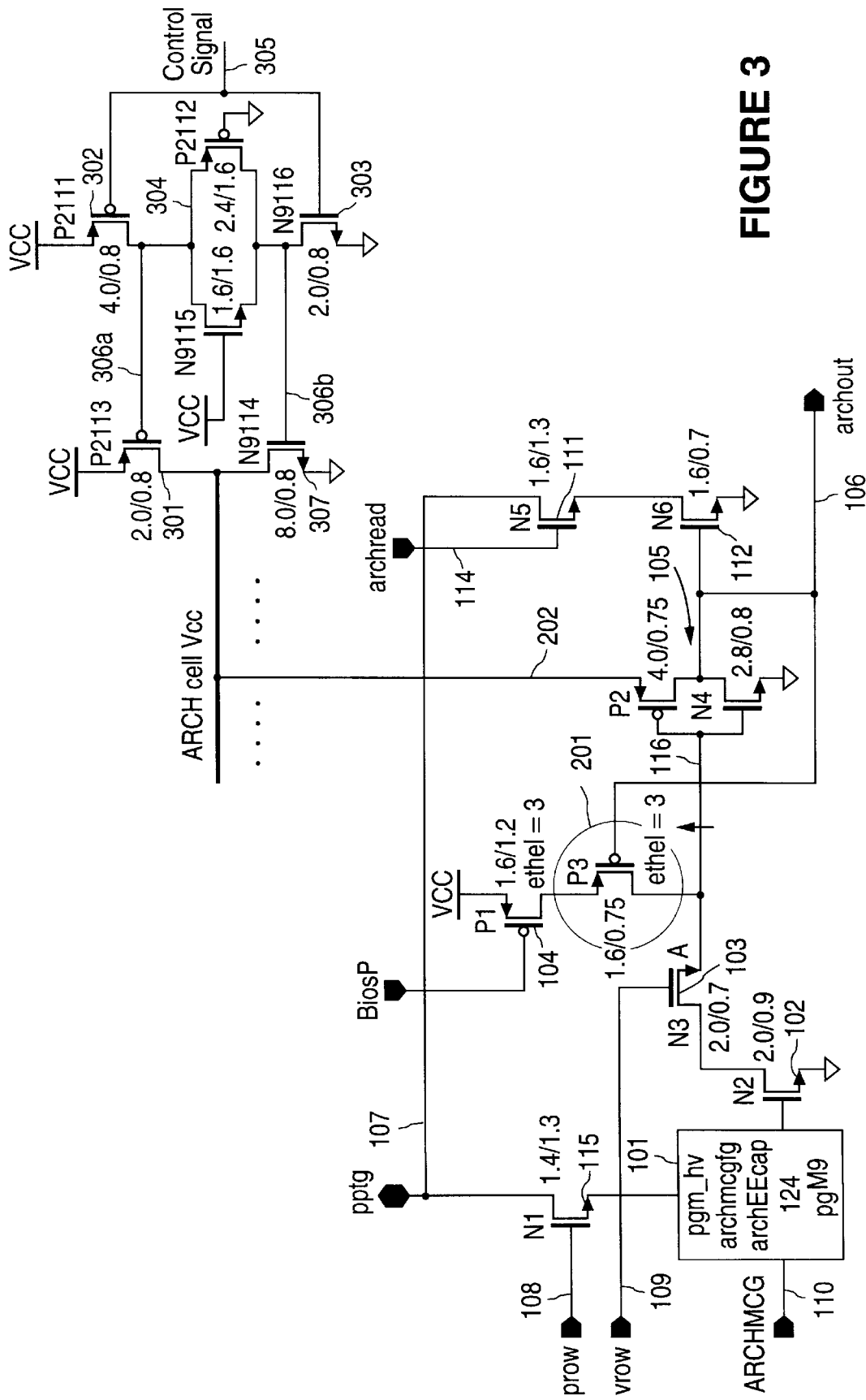
FIG. 3 illustrates the power-up sequence for initializing $E^2$ cell 200.

To prevent terminal 106 of $E^2$ cell 200 to be initialized to a logic high voltage, for an erased cell, a power-up sequence is provided, which is illustrated in FIG. 3. FIG. 3 shows terminal 202 coupled to a power bus "Arch_cell_Vcc", which is brought to the supply voltage $V_{CC}$ upon receiving a control signal at terminal 305. Transistors 301, 302, 303, 304 and 307 form a conventional non-inverting buffer. When the control signal at terminal 305 is not asserted (i.e., at a logic low voltage), terminals 306a and terminal 306b are at supply voltage $V_{CC}$, since PMOS transistor 302 is conducting and NMOS transistor 303 is not conducting. Consequently, NMOS transistor 307 pulls terminal 202 to ground. When the control signal at terminal 305 is asserted, transistor 303 brings terminals 306a and 306b to ground. As a result, PMOS transistor 301 pulls terminal 202 to supply voltage $V_{CC}$.

Upon power-up, the control signal at terminal 305 is not initially asserted. The gate terminal of PMOS transistor 104 receives a predetermined bias voltage. Terminals 202 and 109 are maintained at ground. As a result, terminal 106 is maintained at ground, thereby ensuring that PMOS transistors 104 and 201 pull terminal 116 a logic high voltage close to supply logic high voltage $V_{CC}$. Then, a bias voltage of is applied to terminal 109. If storage transistor 101 is erased, the voltage at terminal 116 remains at the logic high voltage. Conversely, if storage transistor 101 is programmed, NMOS transistor 102 pulls terminal 116 to ground. Thereafter, the control signal at terminal 305 is asserted to bring terminal 202 to supply voltage $V_{CC}$. As a result, terminal 106 is brought to a logic high voltage, if terminal 116 is at ground (i.e., storage transistor device 101 is programmed), and brought to a logic low voltage, if terminal 116 is at logic high (i.e., storage transistor device 101 is erased).

Figure 4:
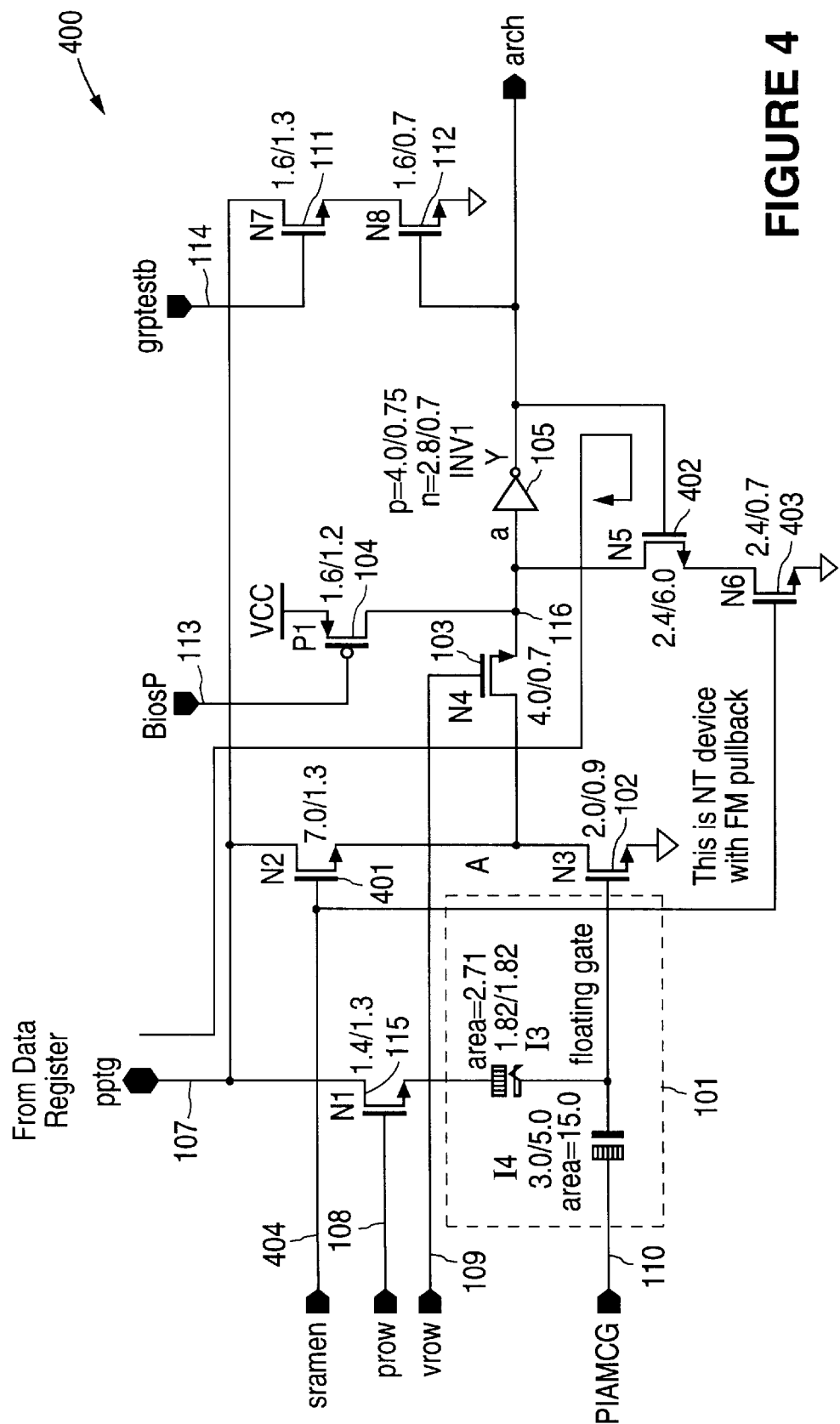
FIG. 4 is a schematic circuit of $E^2$ cell 400, which can be written and read as a static random access memory (SRAM) cell during testing.

According to the present invention, an $E^2$ cell can be modified to isolate storage transistor device 101 from the rest of the $E^2$ cell of a programmable integrated circuit for testing, with the $E^2$ cell behaving as though it is a static random access memory (SRAM) cell. One example of this modification is illustrated by $E^2$ cell 400 of FIG. 4. As shown in FIG. 4, $E^2$ cell 400 differs from $E^2$ cell 100 of FIG. 1 by including NMOS transistors 401, 402 and 403, and receiving an enable signal SRAMEN at terminal 404. With storage logic device 101 erased, when asserted (i.e., at a logic high voltage), enable signal SRAMEN at terminal 404 allows $E^2$ cell 400 to operate as an SRAM cell. When enable signal SRAMEN is not asserted (i.e., at a logic low voltage), NMOS transistors 401 and 403 are non-conducting, so that $E^2$ cell 400 is functionally equivalent to $E^2$ cell 100 discussed above. Thus, during functional operation, when enable signal SRAMEN is not asserted, $E^2$ cell 400 operates substantially identically to $E^2$ cell 100.

To write into $E^2$ cell 400 as an SPAM cell, storage transistor device 101 is first erased, such that NMOS transistor 102 becomes non-conducting. A logic level voltage is provided at terminal 107. When enable signal SRAMEN is asserted and $E^2$ cell 400 is selected by providing a logic high voltage at terminal 109, if a logic high voltage is provided at terminal 107, conducting transistors 103 and 401 pull terminal 116 towards $V_{CC}$. Consequently, the output voltage of inverter 105 at terminal 106 is a stable logic low voltage. In this instance, NMOS transistor 402 is non-conducting. Conversely, if a logic low voltage is provided at terminal 107, a conductive path is created by NMOS transistors 103 and 401, so that terminal 116 is pulled towards ground. Consequently, inverter 105 provides a logic high output value at terminal 106. The logic high output value at terminal 106 turns on NMOS transistor 402, allowing terminal 106 to be rapidly pulled to ground. As a result, the output value of $E^2$ cell 400 transitions to a stable logic high value. Thus, regardless of the logic value provided at terminal 107, the output terminal of $E^2$ cell 400 at terminal 106 can be considered the inverted output terminal of an SRAM cell. Terminal 116 can be tapped to provide a non-inverted SRAM output value. Since the value at terminal 107 is written into $E^2$ cell 400 without high voltage programming of storage transistor device 101, the time required for writing into $E^2$ cell 400 as an SRAM cell can be shorter than 100 nanoseconds.

$E^2$ cell 200 of FIG. 2 can be modified in the same manner as illustrated by $E^2$ cell 400 above to allow $E^2$ cell 200 to be read and written as an SRAM cell during testing.

Figure 5:
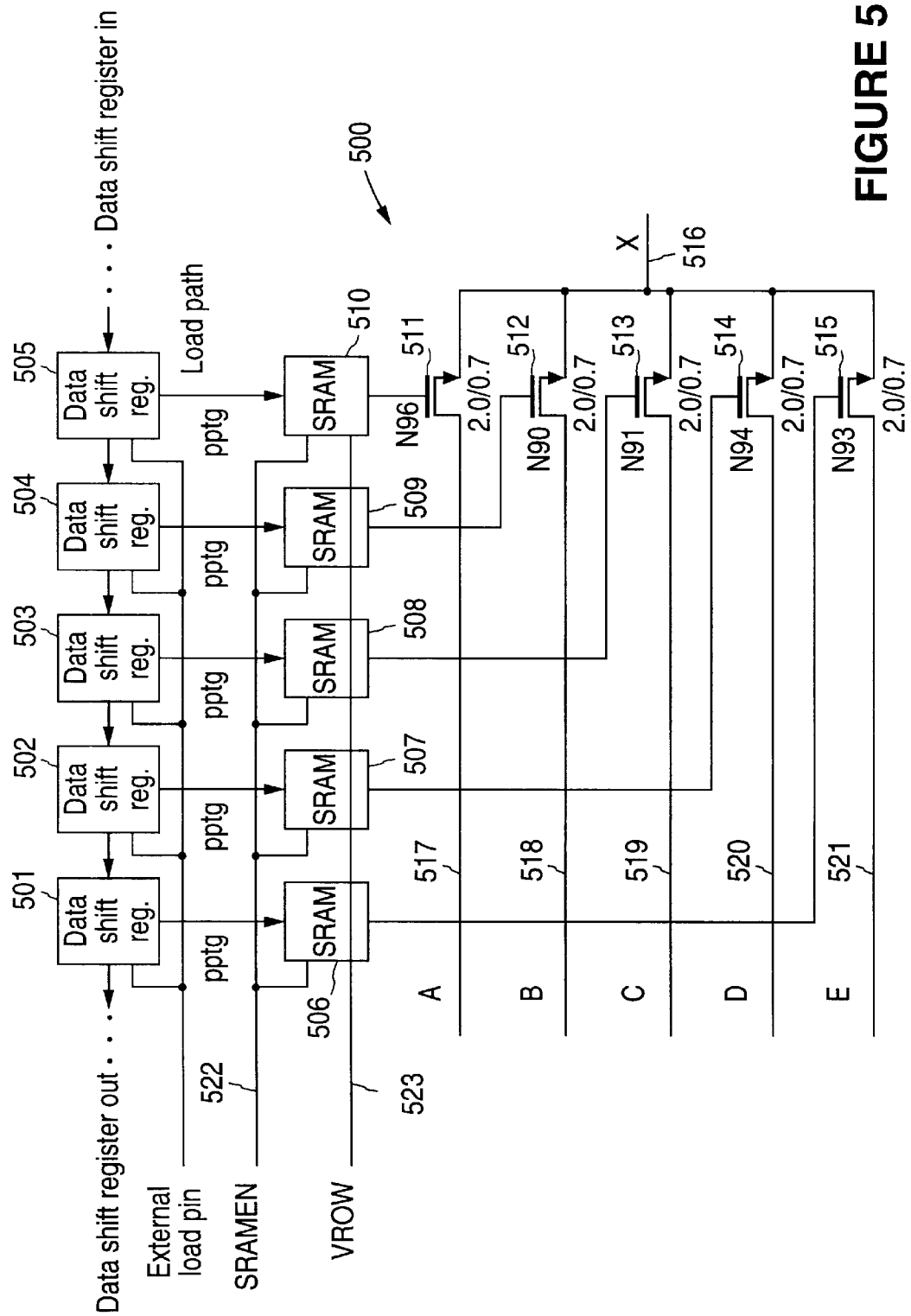
FIG. 5 illustrates the use of modified $E^2$ cells of the present invention (e.g., $E^2$ cell 400) to allow fast testing of a functional circuit configured by these $E^2$ cells.

FIG. 5 illustrates the use of modified $E^2$ cells of the present invention (e.g., $E^2$ cell 400) to allow fast testing of functional circuit 500 configured by these $E^2$ cells. As shown in FIG. 5, functional circuit 500 includes a 5 to 1 multiplexer formed by NMOS transistors 511–515, in which each NMOS transistor is controlled by the inverted SRAM output value of $E^2$ cells 506–510. To test functional circuit 500, a shift register formed by serially connected 1-bit memory cells 501–505 is provided. Initially, memory cells 501–505 contains the bit pattern "11110." This bit pattern is then strobed into $E^2$ cells 505–510 by asserting control signal VROW at terminal 523 and enable signal SRAMEN at terminal 522. As a result, only NMOS transistor 511 of NMOS transistors 511–515 is selected (i.e., made conducting), thus selecting the logic value at terminal 517 to be output at terminal 516. Functional circuit 500 can be tested using a high clock rate (e.g., 10 MHz for 100 nanosecond periods). At each successive time period, a "0" value can be shifted into shift –515 are successively selected to output the corresponding logic values of terminals 517–522 onto terminal 516.

The above detailed description is provided to illustrate the specific embodiments of the present invention and is not intended to be limiting. Numerous modifications and variations within the scope of the present invention are possible. The present invention is set forth in the following claims.

I claim:

1. An electrically erasable non-volatile memory cell, comprising:
   a bit line;
   a word line;
   a storage cell including a floating gate transistor for storing a logic value;
   an input transistor controlled by a first control signal at said word line, said input transistor coupling said bit line to said storage cell to allow, when said first control signal is in an asserted state, a logic voltage on said bit line to be written into said storage cell as said logic value;
   a pass transistor controlled by a second control signal, said pass transistor, when activated by an asserted state of said second control signal, provides said logic value to be read out from said storage cell; and
   a latch coupled to receive at an input terminal said logic value alternatively read from said storage cell or said bit line, and providing said logic value thus received on an output terminal of said electrically erasable non-volatile memory cell.

2. An electrically erasable non-volatile memory cell as in claim 1, wherein said latch comprises:
   a first inverter coupled to said pass transistor; and
   a second inverter cross-coupled to said first inverter for recirculating said logic value on said output terminal to said input terminal, said second inverter being coupled to said bit line to allow said logic voltage to be placed on said input terminal.

3. An electrically erasable non-volatile memory cell as in claim 1, further comprising a pull-up transistor receiving a bias voltage for driving said input terminal to a supply voltage.

4. An electrically erasable non-volatile memory cell as in claim 2, wherein said second inverter is activated by an enable signal.

5. An electrically erasable non-volatile memory cell as in claim 2, wherein said second inverter comprises:
   a first transistor controlled by said enable signal coupled between said input terminal and said bit line; and
   a second transistor having a source and a drain terminal and a control terminal, said drain terminal of said second transistor being coupled to said input terminal, said control terminal being coupled to said output terminal; and
   a third transistor controlled by said enable signal coupling said source terminal of said second transistor to ground.

6. An electrically erasable non-volatile memory cell as in claim 1, further comprising a one-bit shift register having an output terminal coupled to said bit line.

7. A method for rapid testing of an electrically erasable non-volatile memory cell, comprising:
   providing in said erasable non-volatile memory cell, a non-volatile storage cell which receives for storage a logic value from a bit line and provides said logic value to a first terminal;
   providing a latch coupled to said first terminal to receive said logic value into said latch and to provide said logic value received to an output terminal of said electrically erasable non-volatile memory cell; and
   providing a path for directly receiving into said latch said logic value on said bit line.

8. A method as in claim 7, further comprising the step of providing a shift register coupled to provide said logic value on said bit line.

9. A method as in claim 7, wherein said path is activated by an enable signal.

* * * * *